United States Patent
Song et al.

(10) Patent No.: US 8,558,231 B2
(45) Date of Patent: Oct. 15, 2013

(54) ARRAY SUBSTRATE AND METHOD OF MANUFACTURING THE SAME

(75) Inventors: Youngsuk Song, Beijing (CN); Seungjin Choi, Beijing (CN); Seongyeol Yoo, Beijing (CN)

(73) Assignee: Beijing BOE Optoeletronics Co., Ltd., Beijing (CN)

( * ) Notice: Subject to any disclaimer, the term of this patent is extended or adjusted under 35 U.S.C. 154(b) by 716 days.

(21) Appl. No.: 12/724,047

(22) Filed: Mar. 15, 2010

(65) Prior Publication Data

US 2010/0230682 A1 Sep. 16, 2010

(30) Foreign Application Priority Data

Mar. 16, 2009 (CN) .......................... 2009 1 0080227

(51) Int. Cl.
*H01L 31/20* (2006.01)
(52) U.S. Cl.
USPC .................................. 257/57; 257/59; 257/72
(58) Field of Classification Search
USPC .............................. 257/57, 59, 72
See application file for complete search history.

(56) References Cited

U.S. PATENT DOCUMENTS

2005/0036079 A1 2/2005 Chiang et al.
2008/0169470 A1 7/2008 Lim et al.

FOREIGN PATENT DOCUMENTS

CN 101211930 A 7/2008

*Primary Examiner* — Samuel Gebremariam
(74) *Attorney, Agent, or Firm* — Ladas & Parry LLP (57) ABSTRACT

The present invention provides an array substrate comprising: a substrate, having a thin film transistor (TFT) formed thereupon, the TFT having a gate electrode, a source electrode and a drain electrode; a first metal layer, formed on the substrate, and comprising a gate line and the gate electrode of the TFT; a first insulating layer, covering the first metal layer and the substrate; a semiconductor layer, an ohmic contact layer, and a second metal layer, which are sequentially formed on the first insulating layer; a second insulating layer, covering the semiconductor layer, the ohmic contact layer, and the second metal layer; a pixel electrode, provided on the second insulating layer and is connected to the drain electrode. The second metal layer further comprises an etch-blocking pattern in the peripheral area of the pixel electrode within the overlapping region between the pixel electrode and the first metal layer.

7 Claims, 5 Drawing Sheets

ARRAY SUBSTRATE AND METHOD OF MANUFACTURING THE SAME

BACKGROUND

The present invention relates to an array substrate and a method of manufacturing the same.

A liquid crystal display (LCD) is one type of flat panel displays (FPD). Based on the electrical field used to drive liquid crystal, liquid crystal display devices can be categorized into a vertical electric field type and a horizontal electric field type. Horizontal field type liquid crystal display devices can be further categorized into a fringe field switching (FFS) type and an in-plane switching (IPS) type.

Figure 1:
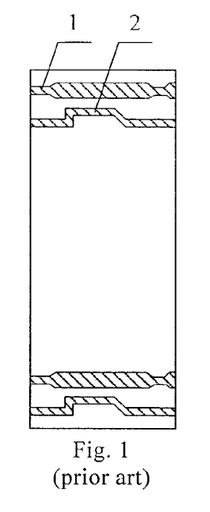
FIG. 1 is a schematic view of an array substrate after a first patterning process of a manufacturing method.
Figure 2:
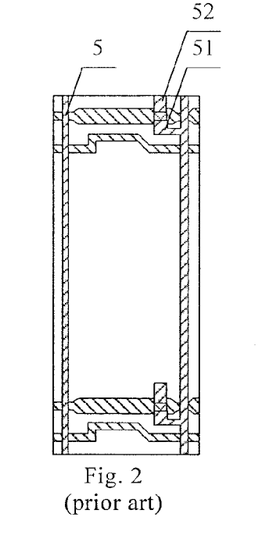
FIG. 2 is a schematic view of the array substrate after a second patterning process of the manufacturing method.
Figure 3A:
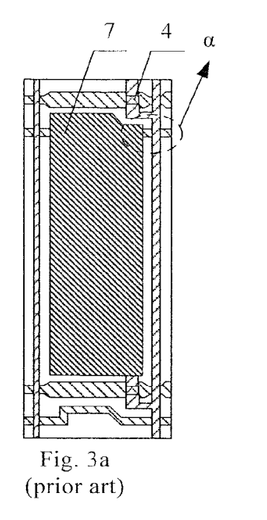
FIG. 3a is a schematic view of the array substrate after a third patterning process of the manufacturing method.
Figure 3B:
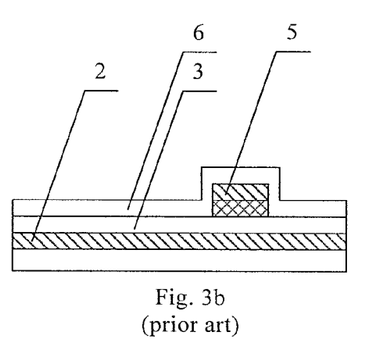
FIG. 3b is a cross-sectional view of a α region after depositing a second insulating layer during the third patterning process of the manufacturing method.
Figure 3C:
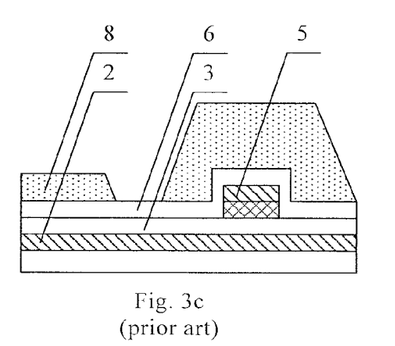
FIG. 3c is a cross-sectional view of the α region after a developing process during the third patterning process of the manufacturing method.
Figure 3D:
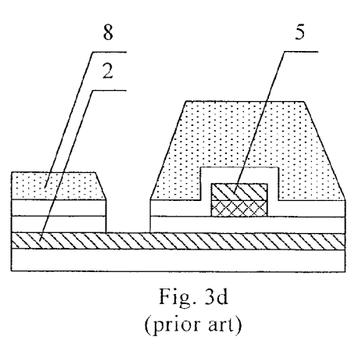
FIG. 3d is the cross-sectional view of the α region after an etching process during the third patterning process of the manufacturing method.
Figure 3E:
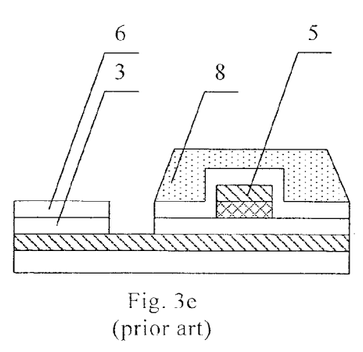
FIG. 3e is the cross-sectional view of the α region after an ashing process during the third patterning process of the manufacturing method.
Figure 3F:
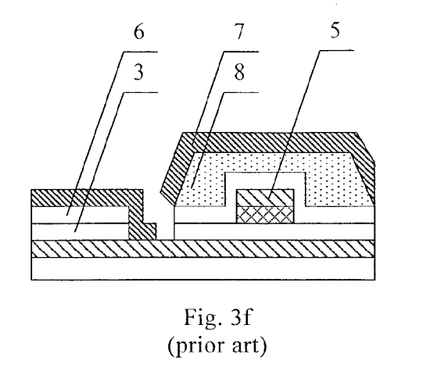
FIG. 3f is the cross-sectional view of the α region after depositing a pixel electrode layer during the third patterning process of the manufacturing method.
Figure 3G:
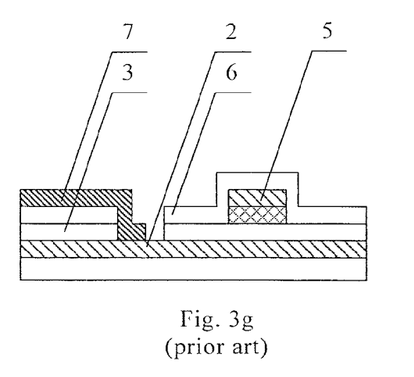
FIG. 3g is the cross-sectional view of the α region after a lifting-off process in the pixel electrode layer during the third patterning process of the manufacturing method.

FIG. 1 is the schematic view of an array substrate after a first patterning process of a manufacturing method. FIG. 2 is the schematic view of the array substrate after a second patterning process of the manufacturing method. FIG. 3a is the schematic view of the array substrate after a third patterning process of the manufacturing method. FIG. 3b is the cross-sectional view of a "α region" after depositing a second insulating layer during the third patterning process of the manufacturing method. FIG. 3c is the cross-sectional view of the α region after a developing process during the third patterning process of the manufacturing method. FIG. 3d is the cross-sectional view of the α region after an etching process during the third patterning process of the manufacturing method. FIG. 3e is the cross-sectional view of the α region after an ashing process during the third patterning process of the manufacturing method. FIG. 3f is the cross-sectional view of the α region after depositing a pixel electrode layer during the third patterning process of the manufacturing method. FIG. 3g is the cross-sectional view of the α region after lifting-off process during the third patterning process of the manufacturing method.

As shown in FIG. 1 to FIG. 3g, to reduce the cost and increase the yield, the method of manufacturing an array substrate of a liquid crystal display device using three patterning processes comprises the following steps.

During the first patterning process, depositing a first metal layer and patterning it into a gate line 1 and a common electrode line 2 through a full tone mask.

During the second patterning process, sequentially depositing a first insulating layer, a semiconductor layer, a heavily doped n+ type semiconductor layer, and a second metal layer. The lamination of the semiconductor layer and the heavily doped n+ type semiconductor layer is used for forming an active layer in the thin film transistor. An active layer 4, a channel of the thin film transistor, a data line 5, a source electrode 51, and a drain electrode 52 are formed through a dual tone mask.

During the third patterning process, depositing a second insulating layer 6, forming a via hole through a dual tone mask, ashing the remaining photoresist 8, depositing a pixel electrode layer, and forming a pixel electrode after lifting off the remaining photoresist.

During forming of the pixel electrode through the lifting-off process in the third patterning process, to assure that the lifting-off process works, the first and the second insulating layers need to be over-etched with a dry method, so as to form a rift section of the pixel electrode layer. However, the time of over-etching should be closely watched. If the time is too short, the rift section of the pixel electrode layer will not be obtained, and if it is too long, the common electrode line under the gate insulating layer will be exposed, which leads to defects in the electrical connection between the formed pixel electrode and the common electrode line. Accordingly, during depositing of the pixel electrode layer, the effort to secure the rift section causes defects in the electrical connection between the formed pixel electrode and the common electrode line.

SUMMARY

An embodiment of the invention provides an array substrate, comprising: a substrate, having a thin film transistor (TFT) formed thereupon, the TFT having a gate electrode, a source electrode, and a drain electrode; a first metal layer, formed on the substrate, and comprising a gate line and the gate electrode of the TFT; a first insulating layer, covering the first metal layer and the substrate; a semiconductor layer, an ohmic contact layer, and a second metal layer, which are sequentially formed on the first insulating layer, wherein the second metal layer comprises a data line and the source electrode and the drain electrode of the TFT, the lamination of the semiconductor layer and the ohmic contact layer constitutes an active layer, and the data line is connected to the source electrode of the TFT; a second insulating layer, covering the semiconductor layer, the ohmic contact layer, and the second metal layer; a pixel electrode, provided on the second insulating layer and is connected to the drain electrode. The second metal layer further comprises an etch-blocking pattern in the peripheral area of the pixel electrode within the overlapping region between the pixel electrode and the first metal layer.

Another embodiment of the invention provides a method of manufacturing an array substrate, comprising steps of: a first patterning process of forming a first metal layer comprising a gate line and a gate electrode of a thin film transistor (TFT) on a substrate; a second patterning process of forming a first insulating layer to cover the first metal layer and the substrate and sequentially forming a semiconductor layer, an ohmic contact layer, a second metal layer that comprises a data line and a source electrode and a drain electrode of the TFT, and an etch-blocking pattern on the first insulating layer, wherein the lamination of the semiconductor layer and the heavily doped n+ type semiconductor layer constitutes an active layer of the TFT, and the data line is connected to the source electrode; and a third patterning process of forming a second insulating layer to cover the semiconductor layer, the heavily doped n+ type semiconductor layer, and the second metal layer, and forming, through a lifting-off process, a pixel electrode connected to the drain electrode of the TFT. The etch-blocking pattern is formed in the peripheral area of the pixel electrode within the overlapping region between the pixel electrode and the first metal layer.

A further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Figure 4:
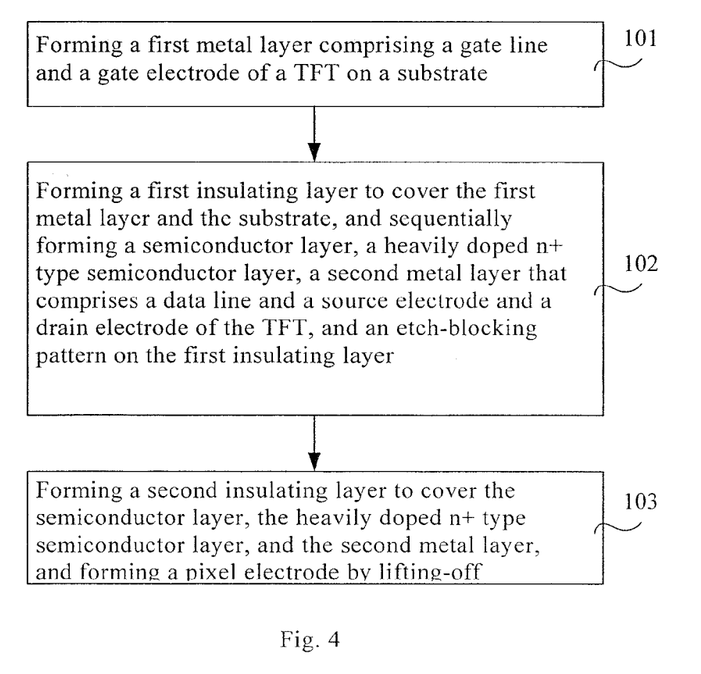
FIG. 4 is a flowchart of the method of manufacturing an array substrate according to a first embodiment of the invention.

First Embodiment of a Method of Manufacturing an Array Substrate of the Invention FIG. 4 is a flowchart of the method of manufacturing the array substrate according to the first embodiment of the invention. As shown in FIG. 4, the manufacturing method of the embodiment comprises the following steps.

Step 101, forming a first metal layer comprising a gate line and a gate electrode of a thin film transistor (TFT) on a substrate.

Step 102, forming a first insulating layer to cover the first metal layer and the substrate, and sequentially forming a semiconductor layer, a heavily doped n+ type semiconductor layer, a second metal layer that comprises a data line and a source electrode and a drain electrode of the TFT, and an etch-blocking pattern on the first insulating layer, wherein the lamination of the semiconductor layer and the heavily doped n+ type semiconductor layer constitutes an active layer of the TFT, and the data line is connected to the source electrode. The etch-blocking pattern is formed in a peripheral area of a pixel electrode to be formed within an overlapping region between the pixel electrode and the first metal layer.

Step 103, forming a second insulating layer to cover the semiconductor layer, the heavily doped n+ type semiconductor layer, and the second metal layer, and forming, through a lifting-off process, a pixel electrode connected to the drain electrode of the TFT.

In the embodiment, step 101 corresponds to the first patterning process, step 102 corresponds to the second patterning process, and step 103 corresponds to the third patterning process. The heavily doped n+ type semiconductor layer is an example of an ohmic contact layer.

In the embodiment, the defects in the electrical connection between the pixel electrode and the first metal layer (e.g., a common electrode line) due to the overlong etching time during the third patterning process can be effectively avoided through the etch-blocking pattern formed in the overlapping region between the pixel electrode and the first metal layer during the second patterning process, which improves the lifting-off process and also improves the three patterning processes.

Furthermore, in the embodiment, during the first patterning process of the embodiment, the first metal layer can be further patterned to form a common electrode line that extends parallel with the gate line.

Furthermore, in the embodiment, during the second patterning process of the embodiment, the etch-blocking pattern is formed in the pixel electrode's peripheral area that is adjacent to the data line. In this case, the etch-blocking pattern in the pixel electrode's peripheral area that is adjacent to the data line may also function as a light-blocking bar, which prevents light leakage between the pixel electrode and the data line. Moreover, the light-blocking bar is, for example, a light-blocking bar formed of a black matrix material and a metal material, with the black matrix material disposed above the metal material.

Furthermore, in the embodiment, during the second patterning process of the embodiment, the etch-blocking pattern may be evenly formed in the peripheral area of the pixel electrode. In this case, the etch-blocking pattern evenly formed in the peripheral area of the pixel electrode can prevent a short circuit from occurring between the pixel electrode and other elements under the pixel electrode.

Furthermore, in the embodiment, during the third patterning process of the embodiment, a via hole is formed in the second insulating layer, for example, through a wet etching process. Compared with a dry etching process, a wet etching process can reduce the etching time.

Furthermore, in the embodiment, during the third patterning process of the embodiment, forming of the pixel electrode through a lifting-off process may comprise the following steps.

Photoresist is applied on the second insulating layer, and the photoresist applied on the second insulating layer is exposed so as to form a fully-exposed region, a partially-exposed region, and a non-exposed region, in which the fully-exposed region corresponds to the source electrode and the peripheral area of the pixel electrode, the partially-exposed region corresponds to the region where the pixel electrode is located, and the non-exposed region corresponds to other regions.

Next, the exposed photoresist is developed so as to expose the second insulating layer in the fully-exposed region of the second insulating layer. In this case, the photoresist remaining on the partially-exposed region has a first thickness, while the photoresist remaining on the non-exposed region has a second thickness. The first thickness is less than the second thickness.

Next, an etching process is performed to remove the second insulating layer and in the fully-exposed region and possibly even further remove the first insulating layer in this region.

Next, an ashing process is performed on the photoresist to remove the remaining photoresist in the partially-exposed region and expose the second insulating layer in the partially-exposed region.

Next, a pixel electrode layer is deposited on the substrate and the remaining photoresist is removed through a lifting-off process, and at the same time the pixel electrode layer on the photoresist is removed, forming the pixel electrode.

Figure 5:
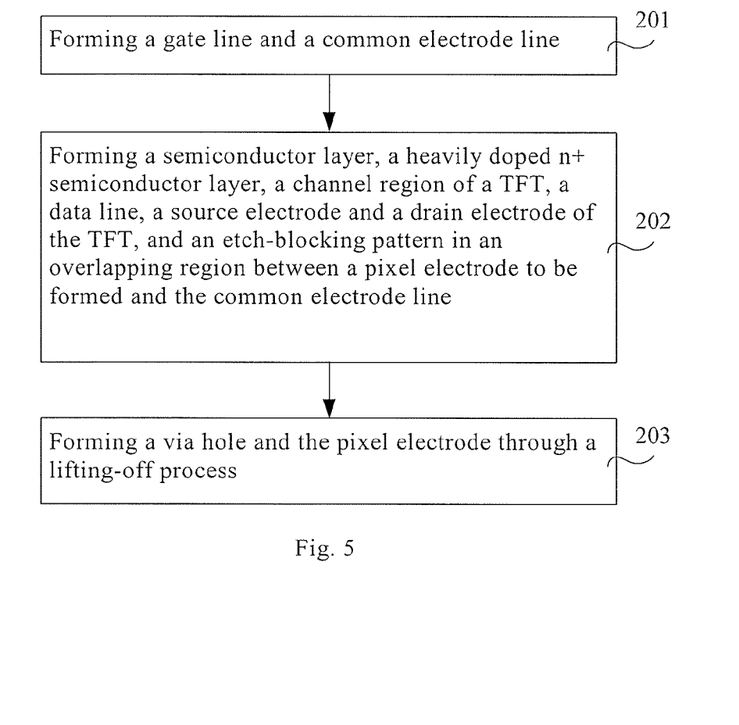
FIG. 5 is a flowchart of the method of manufacturing the array substrate according to a second embodiment of the invention.
Figure 6:
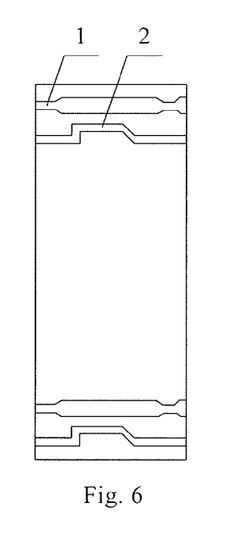
FIG. 6 is a schematic view of an array substrate after a first patterning process of the manufacturing method of manufacturing the array substrate according to the second embodiment of the invention.
Figure 7:
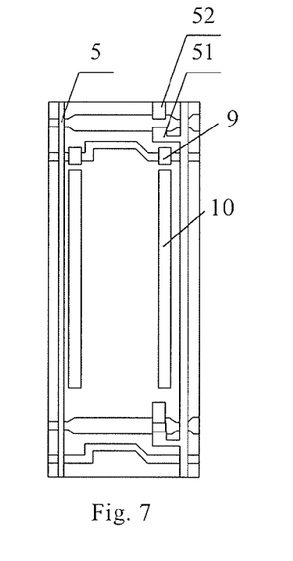
FIG. 7 is a schematic view of the array substrate after a second patterning process of the method of manufacturing the array substrate according to the second embodiment of the invention.
Figure 8A:
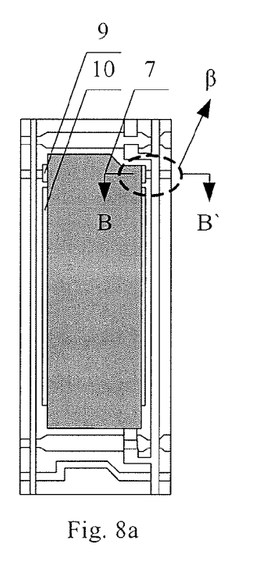
FIG. 8a is a schematic view of the array substrate after a third patterning process of the method of manufacturing the array substrate according to the second embodiment of the invention.
Figure 8B:
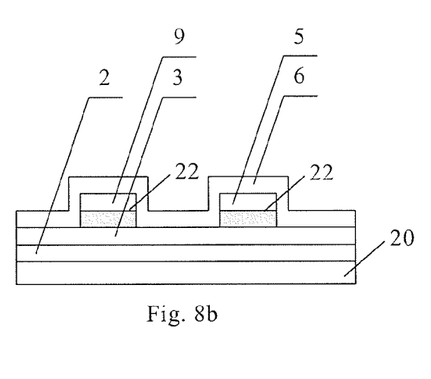
FIG. 8b is a cross-sectional view of a β region after depositing a second insulating layer during the third patterning process of the method of manufacturing the array substrate according to the second embodiment of the invention.
Figure 8C:
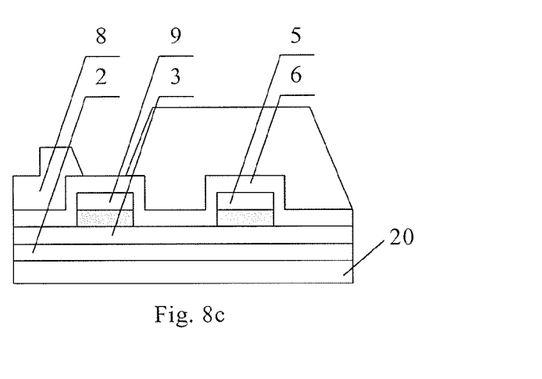
FIG. 8c is a cross-sectional view of the β region after a developing process during a third patterning process of the method of manufacturing the array substrate according to the second embodiment of the invention.
Figure 8D:
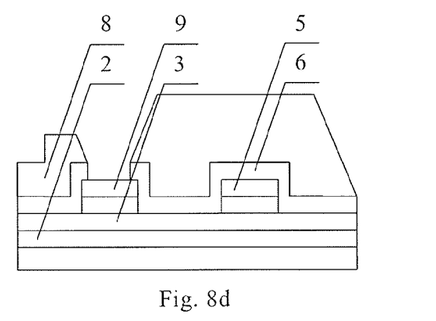
FIG. 8d is a cross-sectional view of the β region after the etching process during the third patterning process of the method of manufacturing the array substrate according to the second embodiment of the invention.
Figure 8E:
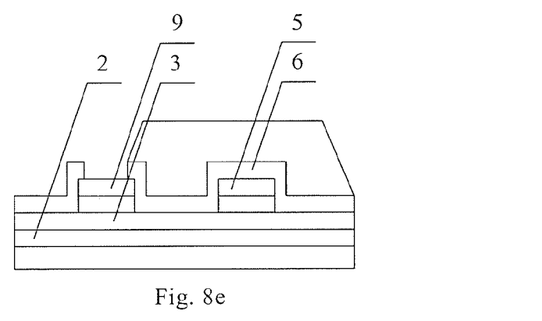
FIG. 8e is a cross-sectional view of the β region after the ashing process during the third patterning process of the method of manufacturing the array substrate according to the second embodiment of the invention.
Figure 8F:
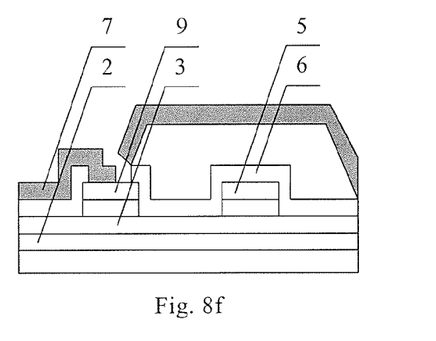
FIG. 8f is a cross-sectional view of the β region after depositing the pixel electrode layer during the third patterning process of the method of manufacturing the array substrate according to the second embodiment of the invention.
Figure 8G:
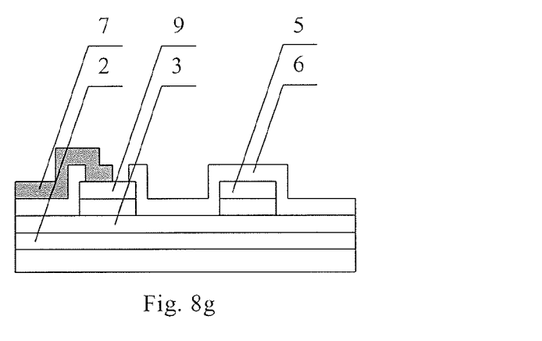
FIG. 8g is a cross-sectional view of the β region after the lifting-off process in the pixel electrode layer during the third patterning process of the method of manufacturing the array substrate according to the second embodiment of the invention.

Second Embodiment of the Method of Manufacturing the Array Substrate of the Invention FIG. 5 is a flowchart of the method of manufacturing the array substrate according to the second embodiment of the invention; FIG. 6 is a schematic view of an array substrate after a first patterning process of the method of manufacturing the array substrate according to the second embodiment of the invention; FIG. 7 is a schematic view of the array substrate after a second patterning process of the method of manufacturing the array substrate according to the second embodiment of the invention; FIG. 8a is a schematic view of the array substrate after a third patterning process of the method of manufacturing the array substrate according to the second embodiment of the invention; FIG. 8b is a cross-sectional view of a β region after depositing a second insulating layer during the third patterning process of the method of manufacturing the array substrate according to the second embodiment of the invention; FIG. 8c is a cross-sectional view of the β region after a developing process during the third patterning process of the method of manufacturing the array substrate according to the second embodiment of the invention; FIG. 8d is a cross-sectional view of the β region after an etching process during the third patterning process of the method of manufacturing the array substrate according to the second embodiment of the invention; FIG. 8e is a cross-sectional view of the β region after an ashing process during the third patterning process of the method of manufacturing the array substrate according to the second embodiment of the invention; FIG. 8f is a cross-sectional view of the β region after depositing a pixel electrode layer during the third patterning process of the method of manufacturing the array substrate according to the second embodiment of the invention; and FIG. 8g is a cross-sectional view of the β region after a lifting-off process in the pixel electrode layer during the third patterning process of the method of manufacturing the array substrate according to the second embodiment of the invention.

As shown in FIG. 5 to FIG. 8g, the manufacturing method of the embodiments comprises the following steps.

Step 201, depositing a first metal layer on a substrate 20, and then applying a layer of photoresist on the first metal layer, exposing and developing the photoresist through a full tone mask while retaining part of the photoresist in the regions for a gate line and a common electrode line, which are to be formed later, and etching to remove the part of the first metal layer that is not covered by the photoresist to form a gate line 1 and a common electrode line 2. The gate electrode of a thin film transistor (TFT) to be formed on the substrate may be a part of the gate line 1 or is connected to the gate line 1. FIG. 6 is the schematic view of the array substrate after the first patterning process. The common electrode line 2 may extend parallel with the gate line 1.

Step 202, sequentially depositing a first insulating layer, a semiconductor layer, a heavily doped n+ type semiconductor layer, and a second metal layer on the substrate 20 after step 201, and applying another layer of photoresist. The lamination of the semiconductor and the heavily doped n+ type semiconductor layer is used to form an active layer in the TFT. The photoresist 8 is exposed through a dual tone mask (e.g., a half tone or gray tone mask) and developed, and the photoresist layer is retained in the regions where a date line 5, a source electrode 51 and a drain electrode 52 of the TFT, an active layer of the TFT, an etch-blocking pattern 9, and a light-blocking bar 10 are to be formed later. The photoresist on the region between the source electrode and the drain electrode is thinner than the photoresist on other regions. The parts of the second metal layer, the heavily doped n+ type semiconductor layer, and the semiconductor layer that are exposed through the remaining photoresist 8 are etched away to form the date line 5, the source electrode 51, the drain electrode 52, the active layer, the etch-blocking pattern 9 and the light-blocking bar 10. Then, through an ashing process, the photoresist 8 in the channel region of the TFT is removed, and the second metal layer on the channel region of the TFT and the heavily doped n+ type semiconductor layer in the channel region are etched away, and the semiconductor layer in the channel region is partially etched in the thickness direction, so as to form the channel of the TFT. Similarly, the lamination 22 of the semiconductor layer and the heavily doped n+ type semiconductor layer under the etch-blocking pattern 9 and the data line 5 is retained. FIG. 7 is the schematic view of the array substrate after the second patterning process.

Step 203, depositing a second insulating layer 6 on the substrate 20 after step 202, and applying another layer of photoresist 8. The photoresist 8 is exposed through a dual tone mask (e.g., a half tone or gray tone mask) and developed, so that the photoresist 8 on a via hole to be formed and on the region, where the etch-blocking pattern is located, is totally removed, and the photoresist 8 on the pixel electrode region is remained but relatively thin. The second metal layer that is not covered by the photoresist 8 is etched to form the via hole. Through an ashing process, the photoresist 8 in the pixel electrode region is removed to expose this region where the pixel electrode is to be formed. A pixel electrode layer is deposited and the remaining photoresist 8 along with the pixel electrode layer thereon is removed, forming the pixel electrode 7, which is connected to the drain electrode in the via hole region.

In the embodiment, step 201 corresponds to the first patterning process, step 202 corresponds to the second patterning process, and step 203 corresponds to the third patterning process.

In the embodiment, the defects in the electrical connection between the pixel electrode and the common electrode line can be effectively avoided with the etch-blocking pattern and the light-blocking bar formed in the overlapping region between the pixel electrode and the common electrode line in the second patterning process of this embodiment, which improves the lifting-off process and also improves the three-patterning (three-mask) processes. Also, the light-blocking bar is formed without adding any additional process. Thereby, it is possible to further prevent light leakage between the pixel electrode and the data line, and the quality of the liquid crystal display is further improved.

In the embodiment, in the step of exposing the photoresist through a dual tone mask during the third patterning process of the embodiments, the photoresist applied on the light-blocking bar to be formed can be further removed. In this case, the step difference between the light-blocking bar and the pixel electrode can be reduced, which prevents defects due to the step difference in a subsequent rubbing process.

In the embodiment, during the second patterning process of the embodiment, after the second metal layer is deposited, a black matrix material can be further deposited to form a light-blocking bar formed of the black matrix material and the metal material. The light-blocking bar thus formed is an example of the etch-blocking pattern formed in the pixel electrode's peripheral area that is adjacent to the data line. In this case, the black matrix material is disposed on the second metal material to further prevent various defects due to the external light being reflected by the light-blocking bar.

Furthermore, in the embodiment, during the third patterning process of the embodiment, the via hole is formed in the second insulating layer, for example, through a wet etching process. Compared with a dry etching process, a wet etching process can reduce the etching time.

First Embodiment of the Array Substrate of the Invention

Figure 9A:
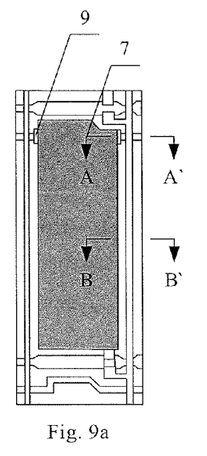
FIG. 9a is a schematic plan view of the array substrate according to the first embodiment of the invention.
Figure 9B:
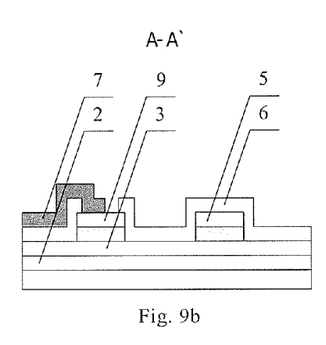
FIG. 9b is a schematic cross-sectional view of FIG. 9a along A-A'.
Figure 9C:
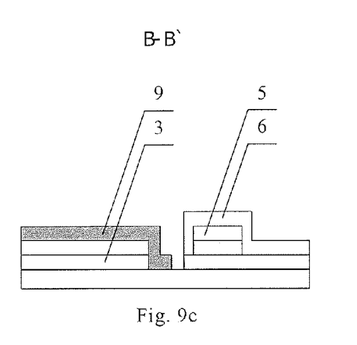
FIG. 9c is a schematic cross-sectional view of FIG. 9a along B-B'.

FIG. 9a is a schematic plan view of the array substrate according to the first embodiment of the invention. FIG. 9b is a schematic cross-sectional view of FIG. 9a along A-A'. FIG. 9c is a schematic cross-sectional view of FIG. 9a along B-B'.

As shown in FIG. 9a to FIG. 9c, the array substrate of this embodiment comprising: a substrate, on which a thin film transistor (TFT) is formed, the TFT having a gate electrode, a source electrode and a drain electrode; a first metal layer, formed on the substrate, and comprising a gate line and the gate electrode of the TFT; a first insulating layer 3, covering the first metal layer and the substrate; a semiconductor layer, a heavily doped n+ type semiconductor layer, and a second metal layer, which are sequentially formed on the first insulating layer, wherein the second metal layer comprises a data line 5 and the source electrode and the drain electrode of the TFT, a lamination of the semiconductor layer and the heavily doped n+ type semiconductor layer constitutes an active layer of the TFT, and the data line is connected to the source electrode of the TFT; a second insulating layer 6, covering the semiconductor layer, the heavily doped n+ type semiconductor layer, and the second metal layer; a pixel electrode 7, provided on the second insulating layer 6 and is connected to the drain electrode. The second metal layer further comprises an etch-blocking pattern 9 in the peripheral area of the pixel electrode within the overlapping region between the pixel electrode and the first metal layer. Here, the heavily doped n+ type semiconductor layer is an example of ohmic contact layer.

In the embodiment, defects in the electrical connection between the pixel electrode and the first metal layer (e.g., a common electrode line) due to the overlong etching time during the third patterning process can be effectively avoided by means of the etch-blocking pattern formed in the overlapping region between the pixel electrode and the first metal layer, which greatly improves the lifting-off process and also improves quality of the array substrate manufactured by the three patterning processes.

Furthermore, in the embodiment, the first metal layer may further comprise a common electrode line 2 that extends parallel with the gate line.

Furthermore, in the embodiment, the etch-blocking pattern of the second metal layer may be further formed in the pixel electrode's peripheral area that is adjacent to the data line. In this case, the etch-blocking pattern in the pixel electrode's peripheral area that is adjacent to the data line may further function as a light-blocking bar, which prevents light leakage between the pixel electrode and the data line. Specifically, the light-blocking bar is formed of a black matrix material and a metal material, with the black matrix material being disposed on the metal material.

Furthermore, in the embodiment, the etch-blocking pattern may be evenly formed in the peripheral area of the pixel electrode. In this case, the etch-blocking pattern evenly formed in the peripheral area of the pixel electrode prevents a short circuit occurring between the pixel electrode and other elements under the pixel electrode.

Second Embodiment of the Array Substrate of the Invention

Figure 10A:
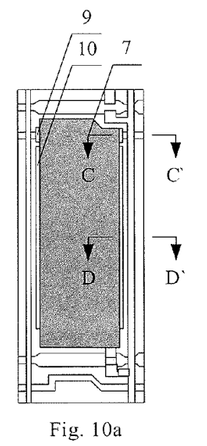
FIG. 10a is a schematic plan view of the array substrate according to the second embodiment of the invention.
Figure 10B:
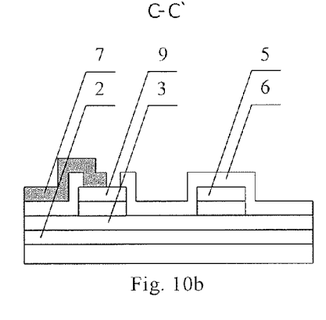
FIG. 10b is a schematic cross-sectional view of FIG. 10a along C-C'.
Figure 10C:
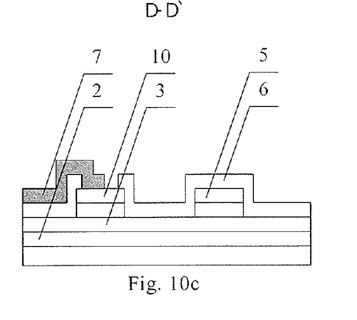
FIG. 10c is a schematic cross-sectional view of FIG. 10a along D-D'.

FIG. 10a is a schematic plan view of the array substrate according to the second embodiment of the invention; FIG. 10b is a schematic cross-sectional view of FIG. 10a along C-C'; FIG. 10c is a schematic cross-sectional view of FIG. 10a along D-D'.

The array substrate of this embodiment comprises: a gate line and a common electrode line 2 on a substrate; a first insulating layer 3 provided on the gate line and the common electrode line 2; an active layer of a thin film transistor (TFT) on the gate line; a source electrode and a drain electrode of the TFT on the active layer, wherein a channel of the TFT is formed between the source electrode and the drain electrode of the TFT, and the source electrode is electrically coupled to a data line 5. An etch-blocking pattern 9 is provided in the peripheral area of the pixel electrode within the overlapping region between the common electrode line 2 and the pixel electrode 7, and a light-blocking bar 10 is provided between the data line 5 and the pixel electrode 7, the data line 5 and the light-blocking bar 10 are formed from the same material layer. The active layer, for example, comprises the lamination of a semiconductor and a heavily doped n+ type semiconductor. A second insulating layer 6 covers the whole surface of the substrate, and a via hole is arranged in the part of the second insulating layer 6 corresponding to the drain electrode of TFT and in the part of the second insulating layer 6 corresponding to the etch-blocking pattern 9. The pixel electrode 7 is disposed on the second insulating layer 6 and is electrically coupled to drain electrode through the via hole arranged in the part of the second insulating corresponding to the drain electrode.

In the embodiment, the defects in the electrical connection between the pixel electrode and the common electrode line due to the overlong etching time during the third patterning process is effectively avoided through the etch-blocking pattern and the light-blocking bar formed in the overlapping region between the pixel electrode and the common electrode line, which improves the lifting-off process. Also, the light-blocking bar is formed without adding any additional process; it is, therefore, possible to further prevent light leakage between the pixel electrode and the data line, and the quality of the liquid crystal display is further improved.

Furthermore, in the embodiment, the light-blocking bar is formed of a black matrix material and a metal material, with the black matrix material being disposed on the metal material, so as to further prevent various defects due to the external light being reflected by the light-blocking bar.

The invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. An array substrate, comprising:
   a substrate having a thin film transistor (TFT) formed thereupon, the TFT having a gate electrode, a source electrode, and a drain electrode;
   a first metal layer formed on the substrate and comprising a gate line and the gate electrode of the TFT;
   a first insulating layer covering the first metal layer and the substrate;
   a semiconductor layer, an ohmic contact layer, and a second metal layer, which are sequentially formed on the first insulating layer, wherein the second metal layer comprises a data line and the source electrode and the drain electrode of the TFT, a lamination of the semiconductor layer and the ohmic contact layer constitutes an active layer, and the data line is connected to the source electrode of the TFT;
   a second insulating layer covering the semiconductor layer, the ohmic contact layer, and the second metal layer; and
   a pixel electrode provided on the second insulating layer and connected to the drain electrode,
   wherein the second metal layer further comprises an etch-blocking pattern in a peripheral area of the pixel electrode within an overlapping region between the pixel electrode and the first metal layer, and the etch-blocking pattern is interposed between the active layer and the pixel electrode.

2. The array substrate according to claim 1, wherein the etch-blocking pattern in the second metal layer is further formed in the pixel electrode's peripheral area that is adjacent to the data line.

3. The array substrate according to claim 1, wherein the etch-blocking pattern in the second metal layer is evenly arranged in the peripheral area of the pixel electrode.

4. The array substrate according to claim 1, wherein the first metal layer further comprises a common electrode line.

5. The array substrate according to claim 4, wherein the etch-blocking pattern in the second metal layer is further formed in an overlapping region between the pixel electrode and the common electrode line.

6. The array substrate according to claim 4, wherein the etch-blocking pattern in the second metal layer is evenly arranged in the peripheral area of the pixel electrode.

7. The array substrate according to claim 4, wherein the common electrode line extends parallel with the gate line.

* * * * *

UNITED STATES PATENT AND TRADEMARK OFFICE
CERTIFICATE OF CORRECTION

| | | |
|---|---|---|
| PATENT NO. | : 8,558,231 B2 | Page 1 of 1 |
| APPLICATION NO. | : 12/724047 | |
| DATED | : October 15, 2013 | |
| INVENTOR(S) | : Youngsuk Song et al. | |

It is certified that error appears in the above-identified patent and that said Letters Patent is hereby corrected as shown below:

On the title page, Item (73) the name of the assignee should be "Beijing BOE Optoelectronics Technology Co., Ltd.".

Signed and Sealed this
Twenty-sixth Day of August, 2014

Michelle K. Lee
*Deputy Director of the United States Patent and Trademark Office*